(12) United States Patent
Liu et al.

(10) Patent No.: US 9,263,520 B2
(45) Date of Patent: Feb. 16, 2016

(54) FACILITATING FABRICATING GATE-ALL-AROUND NANOWIRE FIELD-EFFECT TRANSISTORS

(71) Applicant: GLOBALFOUNDRIES Inc., Grand Cayman (KY)

(72) Inventors: Jin Ping Liu, Ballston Lake, NY (US); Jing Wan, Malta, NY (US); Andy Wei, Queensbury, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 58 days.

(21) Appl. No.: 14/050,494

(22) Filed: Oct. 10, 2013

(65) Prior Publication Data

US 2015/0104918 A1   Apr. 16, 2015

(51) Int. Cl.
| | |
|---|---|
| *H01L 29/06* | (2006.01) |
| *H01L 29/423* | (2006.01) |
| *H01L 29/786* | (2006.01) |
| *H01L 21/00* | (2006.01) |

(52) U.S. Cl.
CPC ...... *H01L 29/0673* (2013.01); *H01L 29/42392* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 5,580,802 A | 12/1996 | Mayer et al. | |
| 6,391,782 B1 | 5/2002 | Yu | |
| 8,338,280 B2 | 12/2012 | Tan et al. | |
| 8,384,065 B2 | 2/2013 | Bangsaruntip et al. | |
| 2005/0003592 A1 | 1/2005 | Jones | |
| 2008/0135949 A1* | 6/2008 | Lo et al. | 257/401 |
| 2013/0313513 A1* | 11/2013 | Cappellani et al. | 257/9 |
| 2015/0034899 A1* | 2/2015 | Ching et al. | 257/9 |
| 2015/0053928 A1* | 2/2015 | Ching et al. | 257/29 |
| 2015/0064891 A1* | 3/2015 | Cheng et al. | 438/585 |

OTHER PUBLICATIONS

Windl, W. et al., "Characterization and Modeling of Atomically Sharp "Perfect" Si:Ge/SiO2 Interfaces", ECS Transactions, vol. 3, No. 7, pp. 539-549 (2006).
Dupre, C. et al., "15nm-Diameter 3D Stacked Nanowires with Independent Gates Operation: ΦFET", Electron Devices Meeting, IEEE International, San Francisco, CA, Dec. 15-17, 2008 (4 pages).
Nakaharai, S. et al., "Formation Process of High-Purity Ge-On-Insulator Layers by Ge-Condensation Technique", Journal of Applied Physics, vol. 105, 024515 (2009) (8 pages).

* cited by examiner

*Primary Examiner* — Evren Seven
(74) *Attorney, Agent, or Firm* — Heslin Rothenberg Farley & Mesiti P.C.; Nicholas Mesiti, Esq.

(57) ABSTRACT

Methods are presented for facilitating fabrication of a semiconductor device, such as a gate-all-around nanowire field-effect transistor. The methods include, for instance: providing at least one stack structure including at least one layer or bump extending above the substrate structure; selectively oxidizing at least a portion of the at least one stack structure to form at least one nanowire extending within the stack structure(s) surrounded by oxidized material of the stack structure(s); and removing the oxidized material from the stack structure(s), exposing the nanowire(s). This selectively oxidizing may include oxidizing an upper portion of the substrate structure, such as an upper portion of one or more fins supporting the stack structure(s) to facilitate full 360° exposure of the nanowire(s). In one embodiment, the stack structure includes one or more diamond-shaped bumps or ridges.

16 Claims, 4 Drawing Sheets

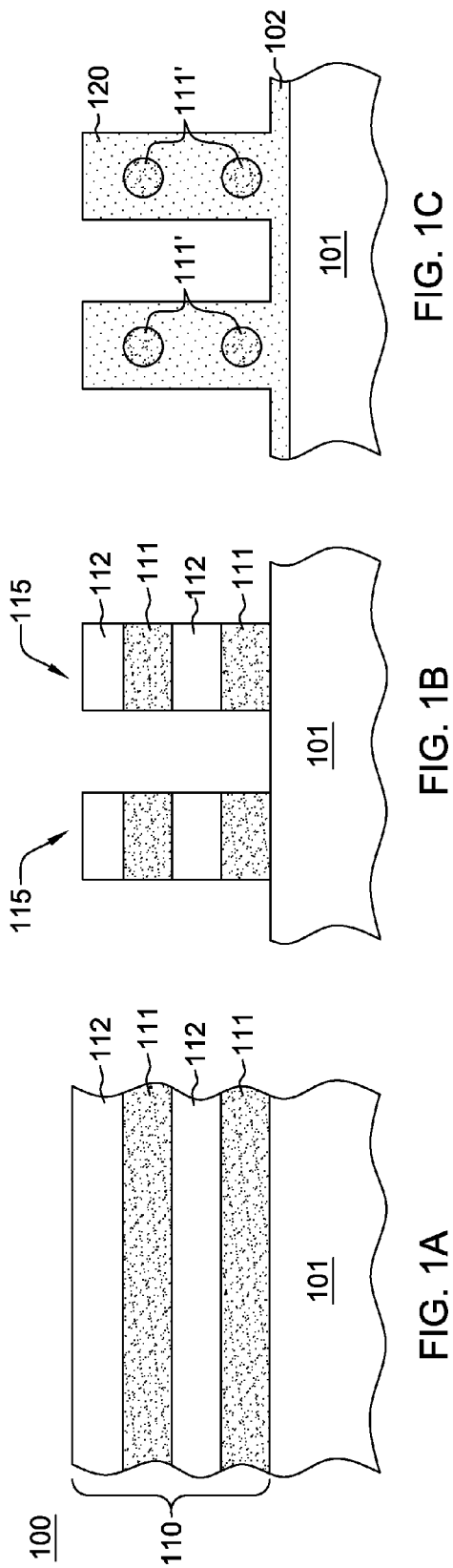

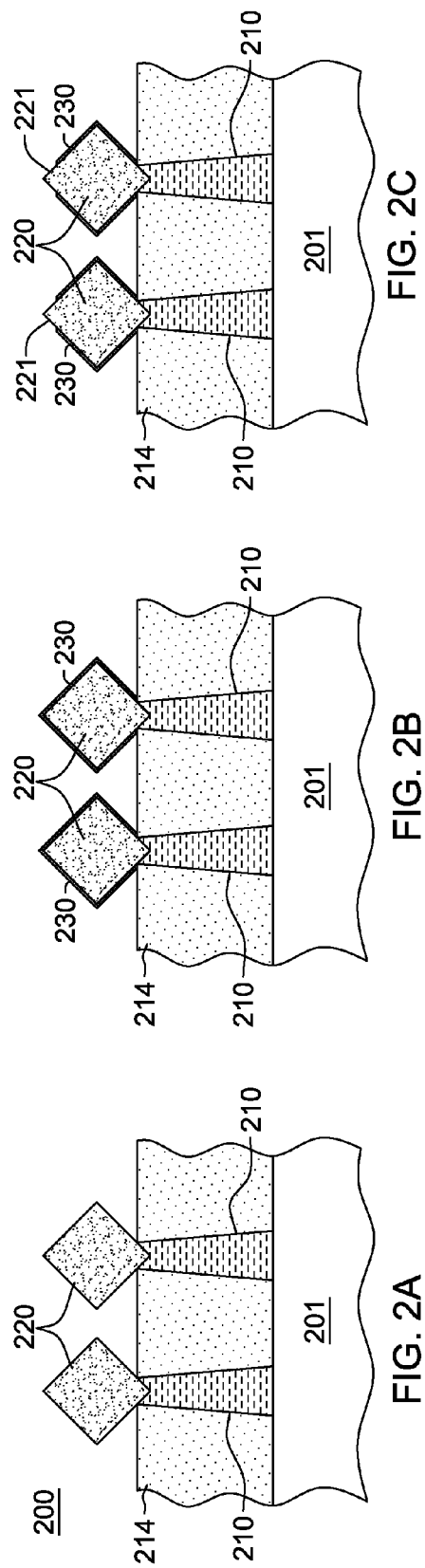

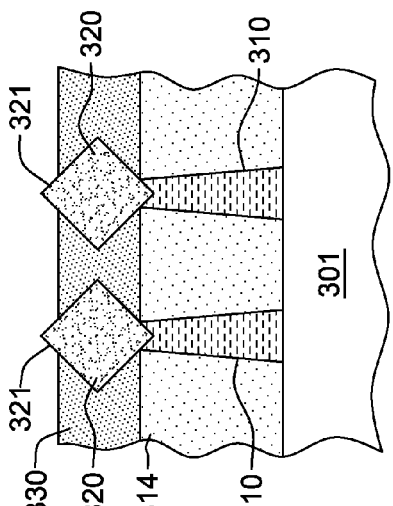
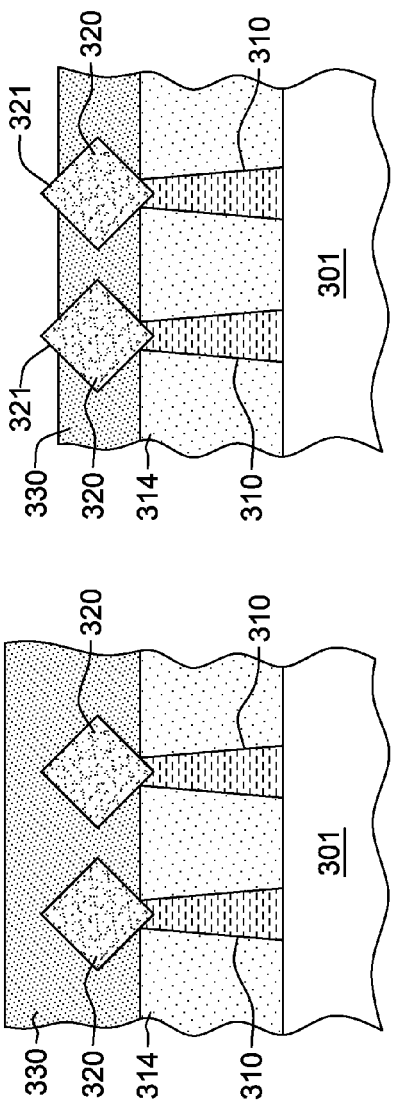
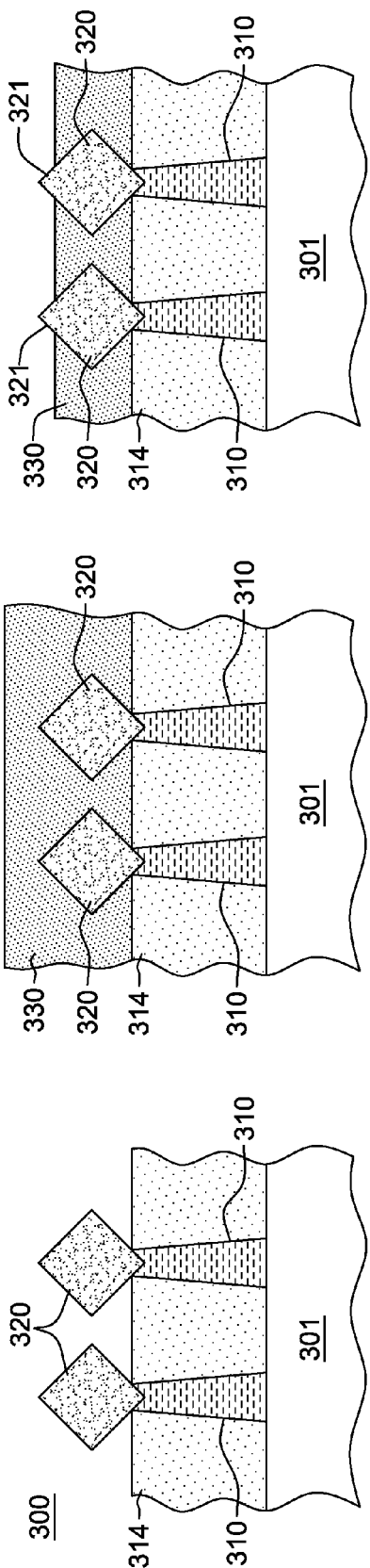
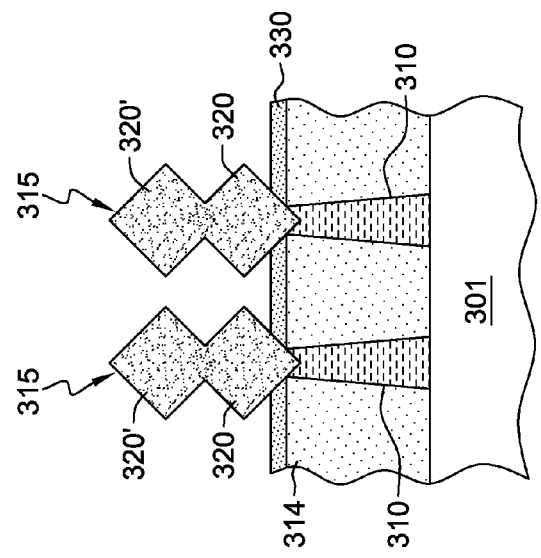
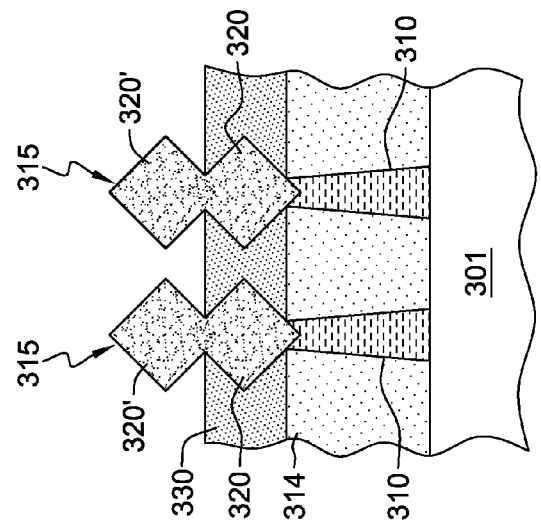

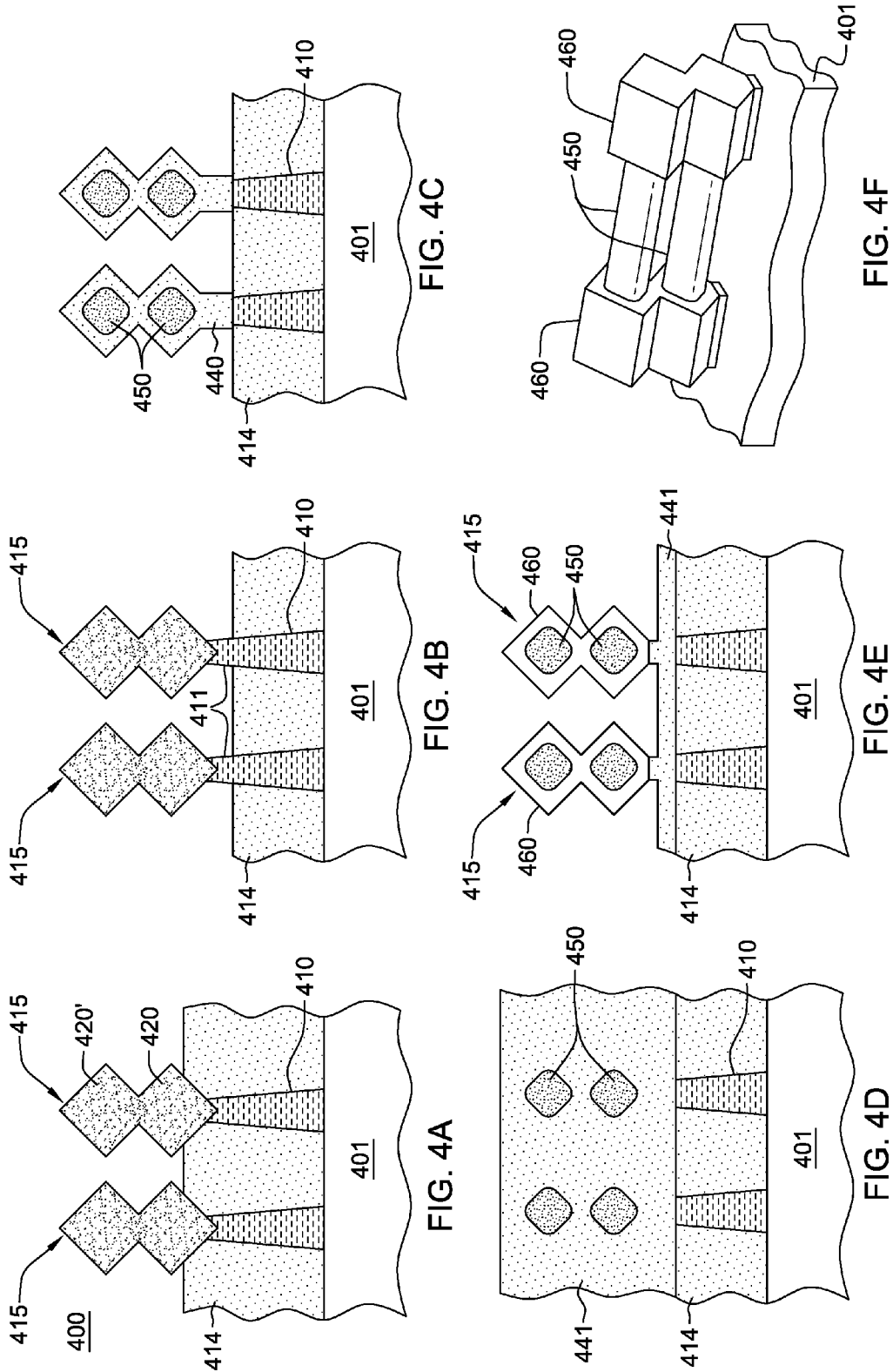

US 9,263,520 B2

FACILITATING FABRICATING GATE-ALL-AROUND NANOWIRE FIELD-EFFECT TRANSISTORS

FIELD OF THE INVENTION

The present invention relates to integrated circuits and to methods of manufacturing integrated circuits, and more particularly, the present invention relates to methods for facilitating fabrication of semiconductor devices having one or more nanowires, such as gate-all-around nanowire field-effect transistors.

BACKGROUND OF THE INVENTION

Complementary metal oxide semiconductor (CMOS) technology is the primary technology employed for ultra-large scale integrated (ULSI) circuits. Over the past decades, reduction in the size of CMOS transistors has been a principle focus of the microelectronics industry.

Transistors, such as metal oxide semiconductor field-effect transistors (MOSFETs), are generally either bulk semiconductor-type devices or silicon-on-insulator (SOI)-type devices. Most integrated circuits are fabricated in a CMOS process on a bulk semiconductor substrate.

In bulk semiconductor-type devices, transistors, such as MOSFETs, are built on top of the surface of a bulk substrate. The substrate is doped to form source and drain regions, and the conductive layer is provided between the source and drain regions. The conductive layer operates as a gate for the transistor, and the gate controls current in a channel between the surface and the drain regions. As transistors become smaller, the body thickness of the transistor (or thickness of the depletion layer below the inversion channel) must be scaled down to achieve superior short-channel performance.

In practice, the geometry of the gate and channel can become quite complicated. In one class of the device, a gate may be placed beneath the channel, as well as on top of the channel and its sides, to define a gate-all-around device, such as a gate-all-around MOSFET device. The gate-all-around configuration advantageously significantly increases the extent of the inversion layer.

BRIEF SUMMARY

Various shortcomings of the prior art are overcome, and additional advantages are provided through the provision, in one aspect, of a method which includes facilitating fabrication of a semiconductor device including at least one nanowire. The facilitating fabrication includes: providing at least one stack structure having at least one layer or bump extending above a substrate structure; selectively oxidizing at least a portion of the at least one stack structure to form at least one nanowire extending therein surrounded by oxidized material of the at least one stack structure; and removing the oxidized material from the at least one stack structure, exposing the at least one nanowire.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 1A-1E depict one embodiment of a method for facilitating fabrication of a semiconductor device including one or more nanowires, in accordance with one or more aspects of the present invention;

FIGS. 2A-2E depict one embodiment of a process for providing a stack structure which includes multiple stacked diamond-shaped bumps or ridges extending from a fin of a substrate structure, and which may be utilized in facilitating fabrication of a semiconductor device including at least one nanowire, in accordance with one or more aspects of the present invention;

FIGS. 3A-3E depict another embodiment of a process for forming multiple stacked diamond-shaped bumps or ridges extending from a fin of a substrate structure, which may be utilized in facilitating fabrication of a semiconductor device having at least one nanowire, in accordance with one or more aspects of the present invention; and FIGS. 4A-4F depict another embodiment of a process for facilitating fabricating a semiconductor device having one or more nanowires from a stack structure such as provided by the processing of FIGS. 2A-2E or FIGS. 3A-3E, in accordance with one or more aspects of the present invention.

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Disclosed herein, at least in part, are methods of facilitating fabrication of a semiconductor device having one or more nanowires. As used herein, a nanowire is an elongate nanostructure with, for instance, a diameter on the order of a few nanometers or less. Alternatively, a nanowire can be defined as an elongate structure having a thickness or diameter constrained to, for instance, ten nanometers or less, and an unconstrained length. By way of example, semiconductor devices are discussed herein using semiconducting nanowires. In one embodiment, the nanowires are incorporated into transistors, such as metal oxide semiconductor field-effect transistors (MOSFETs). Advantageously, the processes disclosed herein are compatible with complementary metal oxide semiconductor (CMOS) processing. As noted, the geometry of the gate and channel of a field-effect transistor (FET) can be quite complicated. In one class of semiconductor device, a gate may be placed beneath the channel, as well as on top of the channel and its sides, to define a gate-all-around device, such as a gate-all-around MOSFET device. A gate-all-around MOSFET device advantageously has a significantly increased inversion layer. In one implementation, the gate-all-around MOSFET may be implemented with a nanowire, around which the gate structure is formed.

The nanowire field-effect transistor with a gate-all-around structure is of significant interest in the semiconductor fabrication industry due to its excellent gate controllability on the channel, and minimized short channel effect. However, fabrication of a nanowire FET can be challenging. Moreover, the drive current of a nanowire FET is largely restricted by the small cross sectional area of the single nanowire. Proposed herein are different processes to fabricate nanowires, including nanowires vertically-oriented in parallel-spaced relation so as to form a type of vertical stack or fin. The vertical alignment of multiple nanowires can provide higher drive current per device area. Further, the processes disclosed herein can be employed with different types of nanowires, such as different types of semiconductor nanowires, including, for instance, silicon nanowire, or silicon germanium or germanium nanowires.

Generally stated, disclosed herein are methods for facilitating fabrication of a semiconductor device having one or more nanowires. The facilitating fabricating includes, for instance: providing at least one stack structure having at least one layer or bump extending above the substrate structure; selectively oxidizing at least a portion of the at least one stack structure to form at least one nanowire extending therein surrounded by oxidized material of the at least one stack structure; and removing the oxidized material from the at least one stack structure, exposing the at least one nanowire. In one embodiment, the stack structure(s) includes multiple layers or bumps extending above the substrate structure, the selectively oxidizing the at least a portion of the stack structure(s) facilitates forming multiple nanowires extending therein surrounded by the oxidized material of the stack structure(s), and the removing of the oxidized material from the stack structure exposes multiple nanowires. By way of example, the multiple nanowires may be spaced apart and extend substantially in parallel, vertical alignment to form, for instance, a fin or extended fin portion.

In one implementation, providing at least one stack structure may include growing multiple layers of a first semiconductor material and a second semiconductor material over the substrate structure, and etching the multiple layers of materials to provide the stack structure(s). By way of specific example, multiple alternating layers of the first semiconductor material and the second semiconductor material may be grown over a substrate structure, such as over one or more fins extending above a substrate. As an example, the first semiconductor material may be or include silicon germanium (SiGe), and the second semiconductor material may be or include silicon (Si).

In one embodiment, the selectively oxidizing may include oxidizing an upper portion of the substrate structure, and the removing may include removing oxidized material from the upper portion of the substrate structure to facilitate full 360° exposure of at least a portion of the at least one nanowire, for instance, to facilitate subsequently forming a gate-all-around structure around the exposed nanowire(s).

In one implementation, the stack structure includes one or more bumps (such as one or more ridges) extending above the substrate structure, and the one or more bumps may be configured or oriented as diamond-shaped bumps. By way of example, multiple diamond-shaped bumps may be grown using successive epitaxial processes such as described herein below. In one implementation, the one or more bumps extend from an upper portion of a fin of the substrate structure, and the selectively oxidizing may include oxidizing an upper portion of the fin. In such a case, the removing includes removing (at least in part) the oxidized material of the upper portion of the fin, for instance, to facilitate full 360° exposure of a lower-most nanowire.

Different techniques are presented for establishing, in certain embodiments, multiple stacked, diamond-shaped bumps extending above a substrate structure. In one implementation, providing the stack structure may include: forming, via first epitaxial process, a first diamond-shaped bump of the multiple bumps extending from an upper portion of the substrate structure (such as an upper portion of a fin extending above a substrate); providing a hard-mask layer conformally wrapping around the first diamond-shaped bump; etching the hard-mask layer to reveal a tip or upper portion of the first diamond-shaped bump; forming via a second epitaxial process, a second diamond-shaped bump extending from the first diamond-shaped bump; and subsequently removing the hard-mask layer from the first diamond-shaped bump to reveal the multiple bumps. If three or more diamond-shaped bumps are desired, the process is repeated for each successive bump being grown in the stack structure (or fin).

In an alternate process, providing the stack structure may include: growing, via a first epitaxial process, a first diamond-shaped bump of the multiple bumps from an upper portion of the substrate structure; depositing an isolation layer covering over the first diamond-shaped bump; etching the isolation layer to reveal a tip or upper portion of the first diamond-shaped bump; growing, via second epitaxial process, a second diamond-shaped bump from the first diamond-shaped bump; and further etching the isolation layer to reveal the first diamond-shaped bump and the second diamond-shaped bump of the multiple bumps. Again, if three or more diamond-shaped bumps are desired, this process may be repeated for each successive bump being grown in the stack structure (or fin).

Reference is made below to the drawings, which are not drawn to scale for ease of understanding, wherein the same reference numbers used throughout different figures designate the same or similar components.

FIGS. 1A-1E depict one embodiment of a process for facilitating fabrication of a semiconductor device having at least one nanowire, in accordance with one or more aspects of the present invention. Referring to FIG. 1A, the depicted process includes providing an intermediate structure 100 which includes a substrate structure 101 and multiple layers 110 disposed above substrate structure 101. In this implementation, the multiple layers 110 include multiple alternating layers of a first material 111 and a second material 112. In one implementation, the first material and the second material are each semiconductor materials, such as silicon germanium and silicon, respectively. These multiple layers 110 may be grown over a bulk substrate structure 101, which itself may, in one embodiment, be a semiconductor substrate, such as a silicon substrate. In another implementation, substrate structure 101 may be a crystalline-on-insulator (COI) substrate with, for instance, a top or surface silicon layer, and a bulk silicon substrate separated by a buried oxide therebetween to form a silicon-on-insulator substrate. Other types of crystalline materials, such as silicon germanium may also be useful.

In one example, substrate structure 101 may be a bulk semiconductor material such as, for example, a bulk silicon wafer. In another embodiment, substrate structure 101 may be any silicon-containing substrate including, but not limited to, a substrate fabricated of or including silicon (Si), single crystal silicon, polycrystalline Si, amorphous Si, silicon-on-nothing (SON), silicon-on-insulator (SOI), or silicon-on-replacement insulator (SRI) or the like. Substrate structure 101 may in addition or instead include various isolations, dopings and/or device features. For instance, the substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, first material 111 may be epitaxially grown or deposited over substrate structure 101, and may be an epitaxial single crystalline semiconductor layer. For example, first material 111 may include a layer of silicon germanium, which may be expressed as $Si_{1-x}Ge_x$ wherein x, the atomic ratio of germanium in silicon, may be less than or substantially equal to about 1, although the atomic ratio is about 0.3 to about 0.7 in one example. As a specific example, the atomic ratio of germanium present in the layer of silicon germanium may be about 0.5. Silicon germanium first material 111, may be formed (for example) by various epitaxial growth processes such as ultra-high vacuum chemical vapor deposition (UHV-CVD), low-pressure CVD (LPCVD), reduced-pressure CVD (RPCVD), rapid thermal CVD (RTCVD), or molecular beam epitaxy (MBE). In one example, the CVD-based epitaxial growth may take place at a temperature of between about 600° C. to about 1100° C., while the MBE may typically use a lower temperature. In a specific example, the selective epitaxial growth of the silicon germanium layer may be performed using halogermanes and silanes as the source gases at temperatures below 600° C. A silicon germanium first material 111 may have a thickness of between about 10 to 100 nanometers, depending on the metastable thickness of the $Si_{1-x}Ge_x$ layer.

Deposition of second material 112 over first material 111 may occur using processes such as CVD or MBE, and the thickness may be about 10 nanometers to about 100 nanometers, by way of example only. In a specific example, the thickness of second material 112 may be between, for instance, 10 nanometers and 100 nanometers, and second material, such as a layer of silicon, may be grown by flowing over the structure a reactant gas, such as dichlorosilane $SiH_2Cl_2$, trichlorosilane $SiHCl_3$, silicontetrachloride $SiCl_4$ or silane $SiH_4$ together with a carrier gas such as hydrogen gas to form a uniform silicon second material 112.

As illustrated in FIG. 1B, one or more stack structures 115 are provided from the multiple layers 110 of FIG. 1A using lithography and etching processes. In this implementation, stack structures 115 (or fins) include alternating layers of first material 111 and second material 112. As a specific example, the stack structures may be configured and sized as a pattern of fins extending above substrate structure 101. For instance, the stack structures 115 could replace conventional fins and facilitate the fabrication of fin-type devices, such as FinFETs, that is, a fin-based, multi-gate transistor architecture, such as a non-planar, double-gate transistor.

By way of example, formation of stack structures 115 may be achieved through patterning with various approaches such as, for instance, direct lithography; sidewall image transfer technique; extreme ultraviolet lithography (EUV); an e-beam technique; litho-etch litho-etch; or litho-etch litho-freeze. The etching may be performed, for example, by any suitable etching process, such as an anisotropic dry etching process, for instance, reactive-ion-etching (RIE) in sulfur hexafluoride ($SF_6$).

After providing the stack structure(s), the process includes thermally oxidizing the structure to, in one implementation, fully oxidize silicon within the stack structures 115 and obtain oxidized material 120, as illustrated in FIG. 1C. Due to different rages of oxidation, this thermal oxidation process results in a condensing of the first material layers 111 (e.g., silicon germanium layers) into nanowires 111' extending within the respective stack structure 115 and surrounded by oxidized material 120. Also, note that in one embodiment, an upper portion 102 of substrate structure 101 may be oxidized as well during the thermal oxidation process. In addition, note that the oxidation conditions, such as temperature, may be controlled to ensure oxidation of, in this embodiment, the second material faster than the first material, so as to ensure (for instance) oxidation of the silicon faster than the silicon germanium. The silicon germanium may partially oxidize such that the germanium concentration is condensed into the nanowires 111'. In an extreme embodiment, the silicon component of the silicon germanium layer may be fully oxidized, and thus the nanowires may be pure germanium.

As illustrated in FIG. 1D, depending on the device being fabricated one or more supports 130 may be provided at opposite ends of the nanowires. Assuming that nanowire field-effect transistors (FETs) are to be fabricated, these supports 130 may be formed as source and drain regions of the transistor. By way of example, the source and drain regions may respectively include, for instance, different dopants, such as a first polarity-type dopant and a second polarity-type dopant. In one implementation, the first polarity-type dopant may be, for example, a p-type dopant, and the second polarity-type dopant may be, for instance, an n-type dopant.

Note also that as used herein, p-type dopant refers to the addition of an impurity to the gate structure (which includes (for example) a sacrificial material formed of an intrinsic semiconductor) to create deficiencies of valence electrons. Examples of a p-type dopant may include boron, aluminum, gallium, or indium, being added to a polysilicon sacrificial material of the gate structure. The n-type dopant refers to the addition of impurities to, for instance, an intrinsic semiconductor material of the gate structure(s), which contribute more electrons to an intrinsic material, and may include (for instance) phosphorus, antimony, or arsenic.

As illustrated in FIG. 1D, the oxide material 120 (FIG. 1C) is etched away to fully expose, at least in part, the nanowires 111'. The revealed nanowires 111' are, in one embodiment, held in parallel-spaced relation by the supports 130. Note that depending on the implementation, supports 130 may comprise any desired structure or anchor to hold the nanowires in fixed positions before the nanowires are released by etching of the oxide material.

FIG. 1E depicts one embodiment of the semiconductor device of FIG. 1D. In the case where the semiconductor device is, for instance, a MOSFET, the gate structure (not shown) would subsequently be provided between the illustrated source and drain supports 130 so as to surround nanowires 111' and form a gate-all-around structure. Note that the two vertically-aligned nanowires in the stack structure illustrated in FIGS. 1A-1E are presented by way of example only. In other embodiments, one nanowire or three or more nanowires may be formed within the semiconductor device between the supports using the processes disclosed herein.

As noted above, in one implementation, the stack structures may each include or be defined by one or more bumps, which may extend a length across the substrate structure as one or more ridges. For instance, these one or more bumps may be configured or oriented on edge as diamond-shaped bumps, which may be vertically aligned or stacked in the stack structure. FIGS. 2A-2E and FIGS. 3A-3E depict alternate embodiments for providing such stack structures.

Referring first to the process of FIGS. 2A-2E, one embodiment of an intermediate structure 200 is illustrated in FIG. 2A. As shown, intermediate structure 200 includes a substrate structure having, for instance, a substrate 201 and multiple fins 210 extending above substrate 201. In this example, fins 210 are surrounded by an isolation layer 214, such as a shallow trench isolation layer, and each fin 210 includes a diamond-shaped bump 220 extending from an upper portion thereof. In one implementation, diamond-shaped bumps 220 are first diamond-shaped bumps having been formed, for instance, via a first epitaxial process, by growing the bumps from respective upper portions of fins 210.

By way of example, substrate 201 may be a bulk semiconductor material such as, for example, a bulk silicon wafer in a crystalline structure with any suitable crystallographic orientation, for instance, (100) and (110) orientations. In one example, the semiconductor substrate has a planar (100) crystallographic surface orientation (referred to as "(100)" surface) and, where the semiconductor substrate is a wafer, may further include a notch (not shown) at an edge of the wafer, along any suitable direction, such as, for example <110> (most popular) or <100> direction. Note that the crystal direction is indicated by "<100>," while the crystal surface is denoted by (100). By way of an example, substrate 201 may be any silicon-containing substrate including, but not limited to, a substrate fabricated of or including silicon (Si), single crystal silicon, polycrystalline Si, amorphous Si, silicon-on-nothing (SON), silicon-on-insulator (SOI), or silicon-on-replacement insulator (SRI) or the like. Substrate 201 may in addition or instead include various isolations, dopings and/or device features. For instance, the substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof an alloy semiconductor including GaAsP, AlInAs, GaInAs, GaInP, or GaInAsP or combinations thereof.

As one skilled in art will understand, where substrate 201 is a semiconductor wafer including an orientation notch (in <110> or <100> directions), multiple fins 210 may be positioned substantially parallel or perpendicular to the direction as defined by the notch (or flat) pointing to <110> or <100> direction. Multiple fins 210 may exhibit a rectangular shape with an upper surface of (100) crystallographic surface orientation and a (110) crystallographic surface on the sidewall surfaces in case the notch pointing to <110> direction. Alternatively, the crystallographic orientation of the upper surface and the sidewall surface of multiple fins 210 may include a (100) surface orientation, in the case of the substrate including a notch aligned toward <100> direction.

First diamond-shaped bumps 220, may be epitaxially grown from respective upper portions of multiple fins 210 using selective epitaxial growth via various methods, such as, for example, CVD, RPCVD, LPCVD, or other applicable methods. In one example, first diamond-shaped bumps 220 may include or be fabricated of silicon or materials, such as silicon doped with carbon and phosphorous Si:C(P), where the atomic percentage of carbon may be about 1 percent to about 3 percent or silicon doped with phosphorus (SiP), where the atomic percentage of phosphorus may vary, for instance, between about 0.1 percent to about 10 percent. In one example, silicon doped with phosphorus may be formed using gases such as, for example, dichlorosilane ($SiH_2Cl_2$) gas or silane ($SiH_4$) with phosphine ($PH_3$). In another example, the semiconductor source gas may be a silicon source gas, such as, for example, silane ($SiH_4$) gas, a disilane ($Si_2H_6$) gas, a dichlorosilane ($SiH_2Cl_2$) gas, a $SiHCl_3$ gas and a $SiCl_4$ gas or may include a carbon source gas for the growth of SiC.

In another example, first diamond-shaped bumps 220 may include or be fabricated of materials, such as, for example, silicon germanium (SiGe) where the atomic percentage of germanium may vary, for instance, between about 0.1 percent to about 10 percent, and may be epitaxially grown above the silicon (Si) fins. The epitaxial growth may be realized using selective epitaxial growth via various methods, such as, for example, CVD, RPCVD or other applicable methods and may be initiated using a silicon germanium source gas, which may include a stoichiometric ratio of silicon source gas and the germanium source gas. The stoichiometric ratio depends on the percentage of SiGe that is being grown. In addition, the SiGe may be doped as well. The semiconductor source gas may instead be, for example, one of the more advanced gases from the family of germyl-silanes, such as $H_3GeSiH_3$, $(H_3Ge)_2SiH_2$, $(H_3Ge)_3SiH$, or $(H_3Ge)_4Si$.

As illustrated in FIG. 2B, a thin hard-mask or isolation layer 230 is conformally applied to wrap around the first diamond-shaped bumps 220. By way of example, this thin hard-mask layer may be or include an oxide or nitride that is conformally deposited about the exposed surfaces of the first diamond-shaped bumps 220.

By way of example, thin hard-mask or isolation layer 230 may be deposited using conventional deposition processes, such as, for example, chemical vapor deposition (CVD), low-pressure CVD, or plasma-enhanced CVD (PE-CVD). In one example, isolation layer 230, may have a conventional thickness and include or be fabricated of a material such as, for example, silicon nitride. In a specific example, silicon nitride may be deposited using process gases such as, for example, dichlorosilane ($SiH_2Cl_2$) and ammonia ($NH_3$) and using known process conditions.

As shown in FIG. 2C, the tips or upper portions 221 of first diamond-shaped bumps 220 are then revealed by, for instance, slightly etching hard-mask layer 230. For instance, a reactive ion etch process may be employed to slightly reveal the tips 221 of the first diamond-shaped bumps. In one embodiment, hard-mask layer 230 has a thinner hard-mask thickness in the vertical direction, which facilitates this partial reveal of the tips or upper portions 221 only of the first diamond-shaped bumps 220.

Next, as illustrated in FIG. 2D, second diamond-shaped bumps 220' are formed, via a second epitaxial process, from first diamond-shaped bumps 220. The thin hard-mask layer 230 may then be removed as shown in FIG. 2E to, for instance, substantially fully expose the stack structures 215, each of which includes the first and second stacked diamond-shaped bumps 220, 220'. Should a higher stack structure be desired, then multiple cycles of hard-mask or isolation layer deposition, partial etching, and epitaxial processing may be employed to add additional diamond-shaped bumps (or ridges) to the stack structures.

Second diamond-shaped bumps 220', may be epitaxially grown from respective upper portions 221 of first diamond-shaped bumps 220, using selective epitaxial growth via various methods, such as, for example, CVD, RPCVD, LPCVD, or other applicable methods. In one example, second diamond-shaped bumps 220' may include or be fabricated of materials, such as silicon doped with carbon and phosphorous Si:C(P), where the atomic percentage of carbon may be about 1 percent to about 3 percent or silicon doped with phosphorus (SiP), where the atomic percentage of phosphorus may vary, for instance, between about 0.1 percent to about 10 percent. In one example, silicon doped with phosphorus may be formed using gases such as, for example, dichlorosilane ($SiH_2Cl_2$) gas or silane ($SiH_4$) with phosphine ($PH_3$). In another example, the semiconductor source gas may be a silicon source gas, such as, for example, silane ($SiH_4$) gas, a disilane ($Si_2H_6$) gas, a dichlorosilane ($SiH_2Cl_2$) gas, a $SiHCl_3$ gas and a $SiCl_4$ gas or may include a carbon source gas for the growth of SiC.

In another example, second diamond-shaped bumps 220' may include or be fabricated of materials, such as, for example, silicon germanium (SiGe) where the atomic percentage of germanium may vary, for instance, between about 0.1 percent to about 10 percent, and may be epitaxially grown above the silicon (Si) fins. The epitaxial growth may be realized using selective epitaxial growth via various methods, such as, for example, CVD, RPCVD or other applicable methods and may be initiated using a silicon germanium source gas, which may include a stoichiometric ratio of silicon source gas and the germanium source gas. The stoichiometric ratio depends on the percentage of SiGe that is being grown. In addition, the SiGe may be doped as well. The semiconductor source gas may instead be, for example, one of the more advanced gases from the family of germyl-silanes, such as $H_3GeSiH_3$, $(H_3Ge)_2SiH_2$, $(H_3Ge)_3SiH$, or $(H_3Ge)_4Si$.

As noted, FIGS. 3A-3E depicts an alternate embodiment of a process for providing stack structures which include multiple vertically-aligned or stacked bumps, such as multiple vertically-aligned or stacked diamond-shaped bumps (or ridges). As shown in FIG. 3A, in one embodiment, an intermediate structure 300 is obtained, which includes, for instance, a substrate 301 and multiple fins 310 extending above substrate 301. In this example, fins 310 are surrounded by an isolation layer 314, such as a shallow-trench isolation layer, and each fin 310 includes a diamond-shaped bump 320 extending from an upper portion thereof. In one implementation, diamond-shaped bumps 320 are first diamond-shaped bumps having been formed, for instance, via a first epitaxial process, by growing the bumps from respective upper portions of fins 310.

By way of example, substrate 301 may be a bulk semiconductor material such as, for example, a bulk silicon wafer in a crystalline structure with any suitable crystallographic orientation, for instance, (100) and (110) orientations. In one example, the semiconductor substrate has a planar (100) crystallographic surface orientation (referred to as "(100)" surface) and, where the semiconductor substrate is a wafer, may further include a notch (not shown) at an edge of the wafer, along any suitable direction, such as, for example <110> (most popular) or <100> direction. Note that the crystal direction is indicated by "<100>," while the crystal surface is denoted by (100). By way of an example, substrate 301 may be any silicon-containing substrate including, but not limited to, a substrate fabricated of or including silicon (Si), single crystal silicon, polycrystalline Si, amorphous Si, silicon-on-nothing (SON), silicon-on-insulator (SOI), or silicon-on-replacement insulator (SRI) or the like. Substrate 301 may in addition or instead include various isolations, dopings and/or device features. For instance, the substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

As one skilled in art will understand, where substrate 301 is a semiconductor wafer including an orientation notch (in <110> or <100> directions), multiple fins 310 may be positioned substantially parallel or perpendicular to the direction as defined by the notch (or flat) pointing to <110> or <100> direction. Multiple fins 310 may exhibit a rectangular shape with an upper surface of (100) crystallographic surface orientation and a (110) crystallographic surface on the sidewall surfaces in case the notch pointing to <110> direction. Alternatively, the crystallographic orientation of the upper surface and the sidewall surface of multiple fins 310 may include a (100) surface orientation, in the case of the substrate including a notch aligned toward <100> direction.

Diamond-shaped bumps 320, may be epitaxially grown from respective upper portions of multiple fins 310 using selective epitaxial growth via various methods, such as, for example, CVD, RPCVD, LPCVD, or other applicable methods. In one example, first diamond-shaped bumps 320 may include or be fabricated of materials, such as silicon doped with carbon and phosphorous Si:C(P), where the atomic percentage of carbon may be about 1 percent to about 3 percent or silicon doped with phosphorus (SiP), where the atomic percentage of phosphorus may vary, for instance, between about 0.1 percent to about 10 percent. In one example, silicon doped with phosphorus may be formed using gases such as, for example, dichlorosilane ($SiH_2Cl_2$) gas or silane ($SiH_4$) with phosphine ($PH_3$). In another example, the semiconductor source gas may be a silicon source gas, such as, for example, silane ($SiH_4$) gas, a disilane ($Si_2H_6$) gas, a dichlorosilane ($SiH_2Cl_2$) gas, a $SiHCl_3$ gas and a $SiCl_4$ gas or may include a carbon source gas for the growth of SiC.

In another example, first diamond-shaped bumps 320 may include or be fabricated of materials, such as, for example, silicon germanium (SiGe) where the atomic percentage of germanium may vary, for instance, between about 0.1 percent to about 10 percent, and may be epitaxially grown above the silicon (Si) fins. The epitaxial growth may be realized using selective epitaxial growth via various methods, such as, for example, CVD, RPCVD or other applicable methods and may be initiated using a silicon germanium source gas, which may include a stoichiometric ratio of silicon source gas and the germanium source gas. The stoichiometric ratio depends on the percentage of SiGe that is being grown. In addition, the SiGe may be doped as well. The semiconductor source gas may instead be, for example, one of the more advanced gases from the family of germyl-silanes, such as $H_3GeSiH_3$, $(H_3Ge)_2SiH_2$, $(H_3Ge)_3SiH$, or $(H_3Ge)_4Si$.

As illustrated in FIG. 3B, an isolation layer 330 is provided, covering over the diamond-shaped bumps 320. Isolation layer 330 may be provided by, for instance, depositing an isolation material, such as an oxide, and chemical-mechanical planarizing the structure.

As shown in FIG. 3C, isolation layer 330 is partially removed, for instance, via anisotropic etching, to reveal a tip or upper portion 321 of the diamond-shaped bumps 320 covered by isolation layer 330. For instance, a reactive ion etch process may be employed to slightly reveal the tips 321 of the diamond-shaped bumps 321.

Next, as illustrated in FIG. 3D, second diamond-shaped bumps 320' are formed, via a second epitaxial process, from first diamond-shaped bumps 320. Thereafter, the isolation layer 330 may be further etched back, as shown in FIG. 3E, to more fully expose the stack structures 315, each of which includes the first and second stacked diamond-shaped bumps 320, 320'. Should a higher stack structure be desired, then multiple cycles of isolation layer deposition, partial etchback, and epitaxial processing may be employed to add additional diamond-shaped bumps (or ridges) to the stack structures 315.

Second diamond-shaped bumps 220', may be epitaxially grown from respective upper portions of first diamond-shaped bumps 220, using selective epitaxial growth via various methods, such as, for example, CVD, RPCVD, LPCVD, or other applicable methods. In one example, second diamond-shaped bumps 220' may include or be fabricated of materials, such as silicon doped with carbon and phosphorous Si:C(P), where the atomic percentage of carbon may be about 1 percent to about 3 percent or silicon doped with phosphorus (SiP), where the atomic percentage of phosphorus may vary, for instance, between about 0.1 percent to about 10 percent. In one example, silicon doped with phosphorus may be formed using gases such as, for example, dichlorosilane ($SiH_2Cl_2$) gas or silane ($SiH_4$) with phosphine ($PH_3$). In another example, the semiconductor source gas may be a silicon source gas, such as, for example, silane ($SiH_4$) gas, a disilane ($Si_2H_6$) gas, a dichlorosilane ($SiH_2Cl_2$) gas, a $SiHCl_3$ gas and a $SiCl_4$ gas or may include a carbon source gas for the growth of SiC.

In another example, second diamond-shaped bumps 220' may include or be fabricated of materials, such as, for example, silicon germanium (SiGe) where the atomic percentage of germanium may vary, for instance, between about 0.1 percent to about 10 percent, and may be epitaxially grown above the silicon (Si) fins. The epitaxial growth may be realized using selective epitaxial growth via various methods, such as, for example, CVD, RPCVD or other applicable methods and may be initiated using a silicon germanium source gas, which may include a stoichiometric ratio of silicon source gas and the germanium source gas. The stoichiometric ratio depends on the percentage of SiGe that is being grown. In addition, the SiGe may be doped as well. The semiconductor source gas may instead be, for example, one of the more advanced gases from the family of germyl-silanes, such as $H_3GeSiH_3$, $(H_3Ge)_2SiH_2$, $(H_3Ge)_3SiH$, or $(H_3Ge)_4Si$.

FIGS. 4A-4F depict another embodiment of a process for facilitating fabrication of a semiconductor device having one or more nanowires, in accordance with one or more aspects of the present invention.

Referring to FIG. 4A, this process includes providing an intermediate structure 400, which includes a substrate structure having a substrate 401 and multiple fins 410 extending above substrate 401. In this example, fins 410 are surrounded by an isolation layer 414, such as a shallow-trench isolation layer, and each fin includes a stack structure 415 extending from an upper surface thereof. One skilled in the art will understand that, isolation layer 414 may be fabricated of or include an oxide material. For instance, high-density plasma (HDP) oxide, high aspect ratio process (HARP) oxide or tetraethyl orthosilicate (TEOS) based silicon dioxide may be deposited, using plasma-enhanced CVD process. Stack structures 415 include, by way of example only, first and second stacked diamond-shaped bumps 420, 420'. Stack structures 415 may have been formed, for instance, via epitaxial processing using the approach of FIGS. 2A-2E, or alternatively, the approach of FIGS. 3A-3E, which are both provided by way of example only.

As illustrated in FIG. 4B, pull-back or partial removal of isolation layer 414 is performed to partially expose upper portion 411 of fins 410 of the substrate structure. After providing the stack structures and pulling back the isolation layer, this process includes thermally oxidizing the structure to, in one implementation, form the separate, vertically-aligned nanowires 450 from the stacked diamond-shaped bumps, and obtain oxidized material 440, as illustrated in FIG. 4C. By way of example, if the original epitaxially-grown, diamond-shaped bumps 420, 420' are silicon-germanium (SiGe), then the germanium content in the resulting nanowires 450 is increased during the thermal oxidation process. In an extreme embodiment, the silicon component of the silicon-germanium bumps may be fully oxidized, in which case the nanowires would be pure germanium (Ge). Note also with reference to FIG. 4C that the exposed upper portion 411 of fins 410 is also oxidized, which will facilitate subsequent 360° exposure of the lower-most nanowires in the stack structures.

As shown in FIG. 4D, gaps between the stack structures 415 are filled with an isolation layer 441, such as an oxide material, which may be deposited above isolation layer 414 and planarized via, for instance, chemical-mechanical planarization. Next, the oxide is etched back to reveal, at least in part, the multiple nanowires 450 within each stack structure 415. Note that to avoid breaking of nanowires 450, supports 460 may remain or be formed at opposite ends of the nanowires 450, as shown in FIG. 4E. Assuming that nanowire field-effect transistors (FETs) are to be fabricated, such as nanowire FinFETs, these supports 460 may be formed and used as source and drain regions of the transistor (due to their relatively large surface area and volume), with the semiconductor device of FIG. 4E illustrated in FIG. 4F, by way of example. Note that in this example, the gate structure is not shown, and would be subsequently formed between the illustrated source and drain supports 460, so as to surround, at least in part, nanowires 450, and form (for instance) a gate-all-around structure. Note that the two vertically-aligned nanowires 450 in the stack structures illustrated in FIGS. 4A-4F are presented by way of example only. In other embodiments, one nanowire, or three or more nanowires, may be formed within the semiconductor device between the supports using the processes disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
facilitating fabrication of a semiconductor device comprising at least one nanowire, the facilitating comprising:
providing at least one stack structure comprising at least one layer or bump extending above a substrate structure;
selectively oxidizing at least a portion of the at least one stack structure to form at least one nanowire extending therein surrounded by oxidized material of the at least one stack structure;
removing the oxidized material from the at least one stack structure, exposing the at least one nanowire;
wherein the at least one layer or bump of the at least one stack structure comprises at least one diamond-shaped bump extending above the substrate structure;
wherein the substrate structure comprises at least one fin extending above a substrate, the at least one bump being part of or extending from the at least one fin at an upper portion of the at least one fin;
wherein the selectively oxidizing comprises selectively oxidizing the upper portion of the at least one fin, and the removing comprises removing, at least in part, the oxidized material from the upper portion of the at least one fin to facilitate full 360° exposure of at least a portion of the at least one nanowire; and
wherein the removing further comprises providing an oxide layer covering over the at least one stack structure, planarizing the oxide layer, and etching back the oxide layer and the oxide material to reveal the at least one nanowire.

2. The method of claim 1, wherein the providing comprises epitaxially growing at least one diamond-shaped bump above the substrate structure.

3. The method of claim 2, wherein the substrate structure comprises at least one fin extending above a substrate, the at least one diamond-shaped bump being part of or extending from the at least one fin at an upper portion of the at least one fin.

4. The method of claim 3, wherein the selectively oxidizing comprises selectively oxidizing the upper portion of the at least one fin, and the removing comprises removing, at least in part, the oxidized material from the upper portion of the at least one fin to facilitate full 360° exposure of at least a portion of the multiple nanowires.

5. The method of claim 4, wherein:
the selectively oxidizing the at least a portion of the at least one stack structure facilitates forming multiple nanowires extending therein surrounded by the oxidized material of the at least one stack structure; and
the removing of the oxidized material from the at least one stack structure exposes the multiple nanowires, the multiple nanowires extending in substantially parallel, vertical alignment.

6. The method of claim 1, wherein the substrate structure comprises at least one fin extending above a substrate, the at least one bump being part of or extending from the at least one fin at an upper portion of the at least one fin.

7. The method of claim 6, wherein the selectively oxidizing comprises selectively oxidizing the upper portion of the at least one fin, and the removing comprises removing, at least in part, the oxidized material from the upper portion of the at least one fin to facilitate full 360° exposure of at least a portion of the multiple nanowires.

8. The method of claim 1, further comprising providing a first support and a second support at opposite ends of the at least one nanowire to support the at least one nanowire upon the removing of the oxidized material from the at least one stack structure.

9. The method of claim 1, wherein:
the selectively oxidizing the at least a portion of the at least one stack structure facilitates forming the multiple nanowires extending therein surrounded by the oxidized material of the at least one stack structure; and
the removing of the oxidized material from the at least one stack structure exposes the multiple nanowires, the multiple nanowires extending in substantially parallel, vertical alignment.

10. The method of claim 9, wherein the selectively oxidizing leaves unoxidized at least a first support portion and a second support portion of the multiple bumps at opposite ends of the multiple nanowires to support the multiple nanowires upon the removing of the oxidized material from the at least one stack structure.

11. The method of claim 10, wherein the semiconductor device comprises a fin field-effect transistor, the first support portion of the multiple bumps is a source region of the fin field-effect transistor, and the second support portion of the multiple bumps is a drain region of the fin field-effect transistor.

12. A method comprising:
facilitating fabrication of a semiconductor device comprising at least one nanowire, the facilitating comprising:
providing at least one stack structure comprising at least one layer or bump extending above a substrate structure;
selectively oxidizing at least a portion of the at least one stack structure to form at least one nanowire extending therein surrounded by oxidized material of the at least one stack structure;
removing the oxidized material from the at least one stack structure, exposing the at least one nanowire;
wherein the at least one stack structure comprises multiple bumps, the multiple bumps being part of or extending above a fin of the substrate structure, and the multiple bumps comprising the at least one layer or bump of the at least one stack structure, wherein each bump is configured as a diamond-shaped bump;
wherein the selectively oxidizing the at least a portion of the at least one stack structure facilitates forming multiple nanowires extending therein surrounded by the oxidized material of the at least one stack structure;
wherein the removing of the oxidized material from the at least one stack structure exposes the multiple nanowires, the multiple nanowires extending in substantially parallel, vertical alignment; and
prior to the selectively oxidizing, removing an upper portion of an isolation layer at least partially surrounding the fin of the substrate structure to expose an upper portion of the fin, and wherein the selectively oxidizing comprises selectively oxidizing the upper portion of the fin, and the removing comprises removing, at least in part, oxidized material from the upper portion of the fin to facilitate full 360° exposure of at least a portion of one nanowire of the multiple nanowires.

13. The method of claim 12, wherein the providing comprises epitaxially growing the diamond-shaped bumps above the substrate structure.

14. The method of claim 13, wherein the substrate structure comprises at least one fin extending above a substrate, the diamond-shaped bumps being part of or extending from the at least one fin at an upper portion of the at least one fin.

15. The method of claim 12, wherein the selectively oxidizing comprises selectively oxidizing the upper portion of the at least one fin, and the removing comprises removing, at least in part, the oxidized material from the upper portion of the at least one fin to facilitate full 360° exposure of at least a portion of the multiple nanowires.

16. The method of claim 15, wherein the selectively oxidizing comprises selectively oxidizing the upper portion of the at least one fin, and the removing comprises removing, at least in part, the oxidized material from the upper portion of the at least one fin to facilitate full 360° exposure of at least a portion of the multiple nanowires.

* * * * *